(12) United States Patent
Yamamoto

(10) Patent No.: US 10,542,639 B2
(45) Date of Patent: Jan. 21, 2020

(54) INFORMATION PROCESSING APPARATUS

(71) Applicant: FUJITSU LIMITED, Kawasaki-shi, Kanagawa (JP)

(72) Inventor: Michiyuki Yamamoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/914,006

(22) Filed: Mar. 7, 2018

(65) Prior Publication Data

US 2018/0288905 A1    Oct. 4, 2018

(30) Foreign Application Priority Data

Mar. 31, 2017    (JP) ................ 2017-071116

(51) Int. Cl.
*H05K 7/20*    (2006.01)

(52) U.S. Cl.
CPC ..... *H05K 7/20736* (2013.01); *H05K 7/20145* (2013.01)

(58) Field of Classification Search
None
See application file for complete search history.

(56) References Cited

U.S. PATENT DOCUMENTS

| | | | | |
|---|---|---|---|---|
| 5,544,012 A | * | 8/1996 | Koike | H05K 7/20572 165/122 |
| 5,860,291 A | * | 1/1999 | Johnson | G06F 1/20 361/692 |
| 8,248,783 B2 | * | 8/2012 | Huang | G06F 1/20 165/104.33 |
| 9,326,419 B2 | * | 4/2016 | Chen | H05K 7/20127 |
| 9,363,926 B1 | * | 6/2016 | Beall | H05K 7/20736 |
| 9,625,959 B1 | * | 4/2017 | Chen | G06F 1/187 |
| 9,648,779 B2 | * | 5/2017 | Kohn | G06F 1/181 |
| 9,949,410 B1 | * | 4/2018 | Kowalski | H05K 7/20745 |
| 10,037,062 B1 | * | 7/2018 | Bhopte | G06F 1/206 |
| 2003/0030978 A1 | * | 2/2003 | Garnett | G06F 1/183 361/679.48 |
| 2007/0133167 A1 | * | 6/2007 | Wagner | H05K 7/20727 361/679.4 |
| 2007/0171607 A1 | | 7/2007 | Tanaka | |
| 2013/0201618 A1 | * | 8/2013 | Czamara | H05K 7/1497 361/679.5 |

FOREIGN PATENT DOCUMENTS

| | | |
|---|---|---|
| JP | 61-194899 | 8/1986 |
| JP | 2007-179655 | 7/2007 |

* cited by examiner

*Primary Examiner* — Courtney L Smith
(74) *Attorney, Agent, or Firm* — Fujitsu Patent Center

(57) ABSTRACT

An information processing apparatus includes a storage space partitioned by a partition plate into a plurality of compartments that respectively store parts to be cooled, and a plurality of cooling devices that respectively send cooling winds for cooling the parts through an air vent placed in an inner surface of the storage space, and over the plurality of compartments, wherein the partition plate includes an opening that is formed in a part adjacent to the air vent, and that connects the plurality of compartments together.

5 Claims, 21 Drawing Sheets though a conceivable option to achieve the redundancy while avoiding the space increase is to install multiple downsized cooling fans, the option is impracticable. That is because: when a cooling fan is downsized, a rate of a decrease in cooling performance of the cooling fan is larger than a rate of the reduction in the size of the cooling fan; and thus, the downsizing of the cooling fan remarkably decreases the cooling performance of the cooling fan. Accordingly, the redundancy achieved by downsizing the cooling fans likely makes it impossible to maintain the cooling performance demanded by the apparatus to be cooled.

INFORMATION PROCESSING APPARATUS

CROSS-REFERENCE TO RELATED APPLICATION

This application is based upon and claims the benefit of priority of the prior Japanese Patent Application No. 2017-71116, filed on Mar. 31, 2017, the entire contents of which are incorporated herein by reference.

FIELD

The embodiment discussed herein is related to an information processing apparatus.

BACKGROUND

Information processing apparatuses are equipped with various types of cooling mechanisms.

Some information processing apparatuses have redundancy. For example, high reliability and stable operation are expected from information processing apparatuses, such as a server and a communication apparatus, used in a large-scale core system. In some cases, meanwhile, space saving is expected from information processing apparatuses. In other cases, for example, lots of components have to be mounted at high density on a 19-inch rack defined by Electronic Industries Alliance (EIA) standards and other standards, when an information processing apparatus is designed which is fitted in the 19-inch rack.

The redundancy of an information processing apparatus is usually achieved by using multiple components that exerts the same function. In the case of a cooling system, for example, installation of two or more cooling fans for a single apparatus to be cooled makes the apparatus capable of continuing its operation even when one of the cooling fans goes out of order. The installation of two or more cooling fans for a single apparatus, however, increases the space occupied by the cooling fans. Although a conceivable option to achieve the redundancy while avoiding the space increase is to install multiple downsized cooling fans, the option is impracticable. That is because: when a cooling fan is downsized, a rate of a decrease in cooling performance of the cooling fan is larger than a rate of the reduction in the size of the cooling fan; and thus, the downsizing of the cooling fan remarkably decreases the cooling performance of the cooling fan. Accordingly, the redundancy achieved by downsizing the cooling fans likely makes it impossible to maintain the cooling performance demanded by the apparatus to be cooled.

The followings are reference documents.
[Document 1] Japanese Laid-open Patent Publication No. 2007-179655 and
[Document 2] Japanese Laid-open Patent Publication No. 61-194899.

SUMMARY

According to an aspect of the invention, an information processing apparatus includes a storage space partitioned by a partition plate into a plurality of compartments that respectively store parts to be cooled, and a plurality of cooling devices that respectively send cooling winds for cooling the parts through an air vent placed in an inner surface of the storage space, and over the plurality of compartments, wherein the partition plate includes an opening that is formed in a part adjacent to the air vent, and that connects the plurality of compartments together.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, descriptions will be provided for an embodiment. The embodiment discussed below is intended only to present an example, and not to limit the technical scope of the disclosure to the following aspect.

Figure 1:
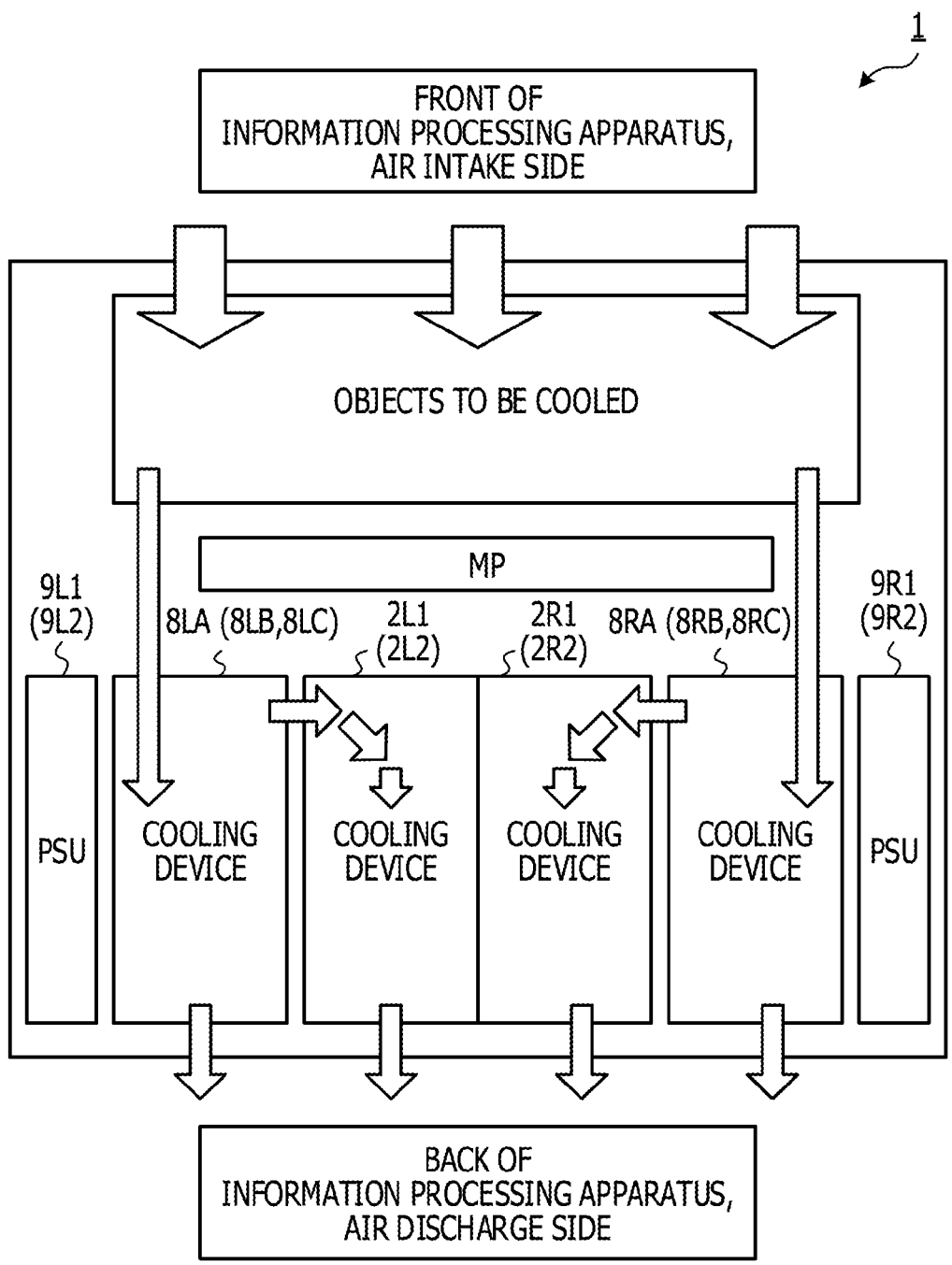
FIG. 1 is a view from above of an internal structure of an information processing apparatus according to an embodiment.
Figure 2:
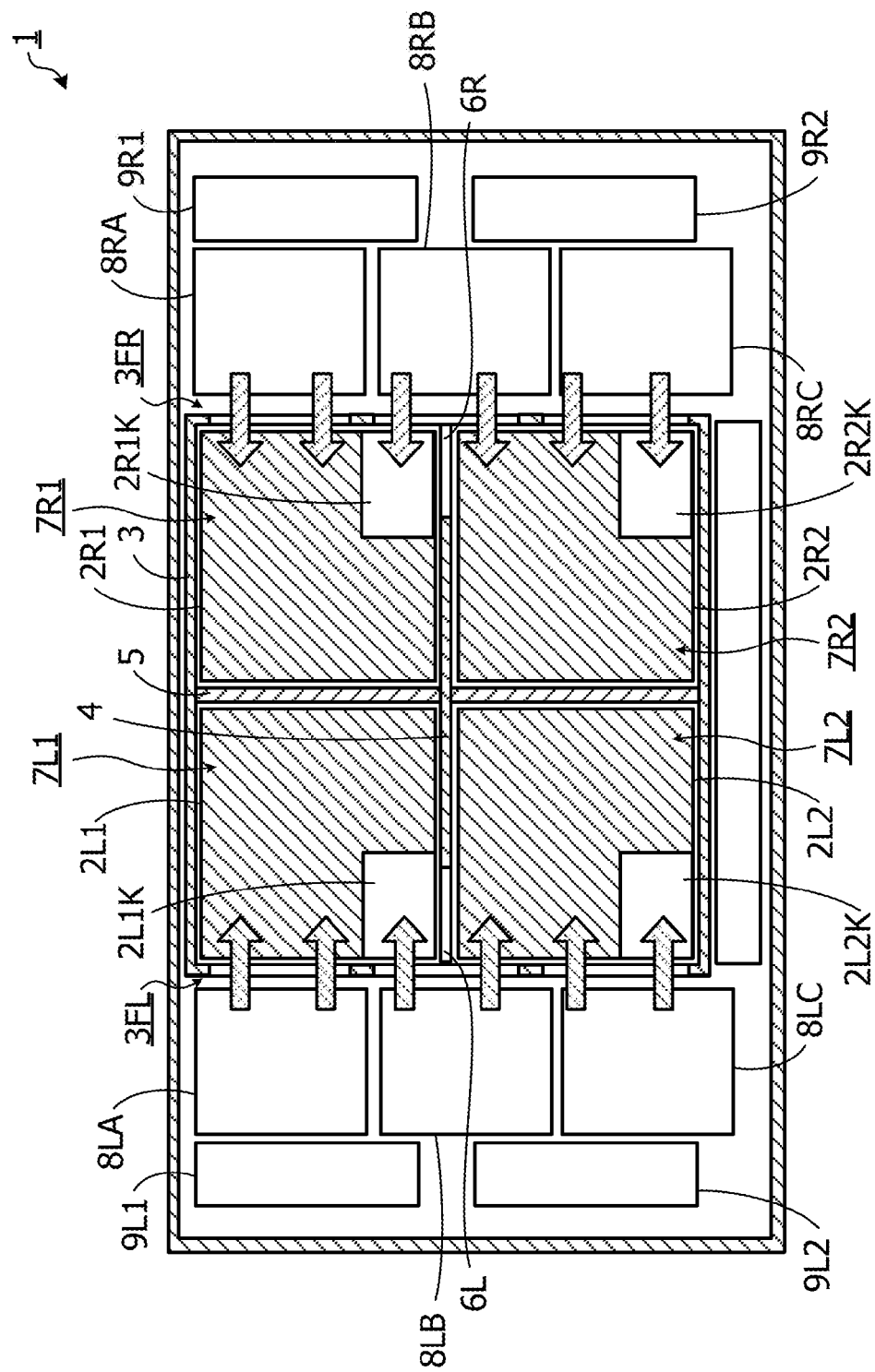
FIG. 2 is a vertical cross-sectional view of a rear-side internal structure of the information processing apparatus according to the embodiment.

FIG. 1 is a view from above of an internal structure of an information processing apparatus according to the embodiment. FIG. 2 is a vertical cross-sectional view of a rear-side internal structure of the information processing apparatus according to the embodiment. The information processing apparatus 1 is an apparatus inclusive of a storage space 3 into and from which various units 2L1, 2L2, 2R1, 2R2 to be selected depending on a specification requested by the user are attachable and detachable in order to allow the user to make the information processing apparatus 1 become more highly functional and more multifunctional. The storage space 3 includes multiple compartments 7L1, 7L2, 7R1, 7R2 into which the storage space 3 is divided by a horizontal partition plate 4 (an example of a "partition plate" in this application) and a vertical partition plate 5 (an example of a "second partition plate" in this application). The compartments 7L1, 7L2, 7R1, 7R2 are large enough to store the units 2L1, 2L2, 2R1, 2R2. The information processing apparatus 1 further includes power supply units 9L1, 9L2, 9R1, 9R2 configured to supply electric power to the respective units 2L1, 2L2, 2R1, 2R2.

Inner wall surfaces of the storage space 3 are provided with air vents 3FL, 3FR. The air vents 3FL, 3FR are placed in locations on inner surfaces of the storage space 3 that extend on the two sides of the horizontal partition plate 4. The horizontal partition plate 4 has openings 6L, 6R respectively in its parts adjacent to the air vents 3FL, 3FR. The opening 6L connects the compartments 7L1, 7L2 together, and the opening 6R connects the compartments 7R1, 7R2 together. Thus, the compartments 7L1, 7L2 separated by the horizontal partition plate 4 communicate with each other through the opening 6L, while the compartments 7R1, 7R2 separated by the horizontal partition plate 4 communicate with each other through the opening 6R. In addition, the air vent 3FL is placed over the compartments 7L1, 7L2, and the air vent 3FR is placed over the compartments 7R1, 7R2. The units 2L1, 2L2, 2R1, 2R2 are provided with cuts 2L1K, 2L2K, 2R1K, 2R2K in their respective locations that correspond to either of the air vents 3FL, 3FR when the units 2L1, 2L2, 2R1, 2R2 are stored in the compartments 7L1, 7R1.

Cooling devices 8LA, 8LB, 8LC, 8RA, 8RB, 8RC are placed on the two sides of the storage space 3. The cooling devices 8LA, 8LB, 8LC, 8RA, 8RB, 8RC are those configured to send cooling wind into the storage space 3. The cooling devices 8LA, 8LB, 8LC are placed at the side of the air vent 3FL, and send the cooling wind into the compartment 7L1, 7L2 inside the storage space 3 through the air vent 3FL. The cooling devices 8RA, 8RB, 8RC are placed at the side of the air vent 3FR, and send the cooling wind into the compartment 7R1, 7R2 inside the storage space 3 through the air vent 3FR.

Meanwhile, the cooling devices 8LA, 8LB, 8LC are placed stacked vertically. Thus, the cooling wind sent from the cooling device 8LA passes through an upper part of the air vent 3FL; the cooling wind sent from the cooling device 8LC passes through a lower part of the air vent 3FL; and the cooling wind sent from the cooling device 8LB passes through a central part of the air vent 3FL. After passing through the central part of the air vent 3FL, the cooling wind is divided by the horizontal partition plate 4 into a cooling wind that passes through the compartment 7L1, and a cooling wind that passes through the compartment 7L2. Accordingly, mainly the cooling device 8LA is in charge of cooling the unit 2L1 stored in the compartment 7L1, while mainly the cooling device 8LC is in charge of cooling the unit 2L2 stored in the compartment 7L2. The cooling device 8LB plays an auxiliary role in cooling the unit 2L1 stored in the compartment 7L1, and the unit 2L2 stored in the compartment 7L2.

What has been discussed about the cooling devices 8LA, 8LB, 8LC is also the case with the cooling devices 8RA, 8RB, 8RC. To put it specifically, like the cooling devices 8LA, 8LB, 8LC, the cooling devices 8RA, 8RB, 8RC are stacked vertically. Furthermore, mainly the cooling device 8RA is in charge of cooling the unit 2R1 stored in the compartment 7R1, while mainly the cooling device 8RC is in charge of cooling the unit 2R2 stored in the compartment 7R2. The cooling device 8RB plays an auxiliary role in cooling both the unit 2R1 and the unit 2R2.

Since the multiple cooling devices 8LA, 8LB, 8LC (8RA, 8RB, 8RC) are placed adjacent to the air vent 3FL (3FR) while the opening 6L (6R) is provided in the part of the storage space 3 that is adjacent to the air vent 3FL (3FR), the information processing apparatus 1 of the embodiment keeps the units 2L1, 2L2 (2R1, 2R2) cooled even if, for example, one of the cooling devices 8LA, 8LB, 8LC (8RA, 8RB, 8RC) fails to supply the cooling wind. Furthermore, even when either of the units 2L1, 2L2 (2R1, 2R2) stored in the compartments 7L1, 7L2 (7R1, 7R2) is detached from the compartments 7L1, 7L2 (7R1, 7R2) for an work or other purpose, the cooling wind sent from the cooling device 8LA (8RA) flows into the compartment 7L1 (7R1), the cooling wind sent from the cooling device 8LC (8RC) flows into the compartment 7L2 (7R2), and the cooling wind sent from the cooling device 8LB (8RB) flows into both of the compartment 7L1 (7R1) and the compartments 7L2 (7R2). Thus, the unit 2L1 (2R1) or the unit 2L2 (2R2) remaining in either of the compartments 7L1, 7L2 (7R1, 7R2) is kept cooled. In other words, the cooling system in the information processing apparatus 1 is duplicated.

Furthermore, although the cooling system in the information processing apparatus 1 is thus duplicated, the cooling device used for the redundancy is limited to the single cooling device 8LB (8RB). This limitation makes it possible to securely make each cooling device sufficiently large without increasing the space occupied by the cooling device.

Figure 3:
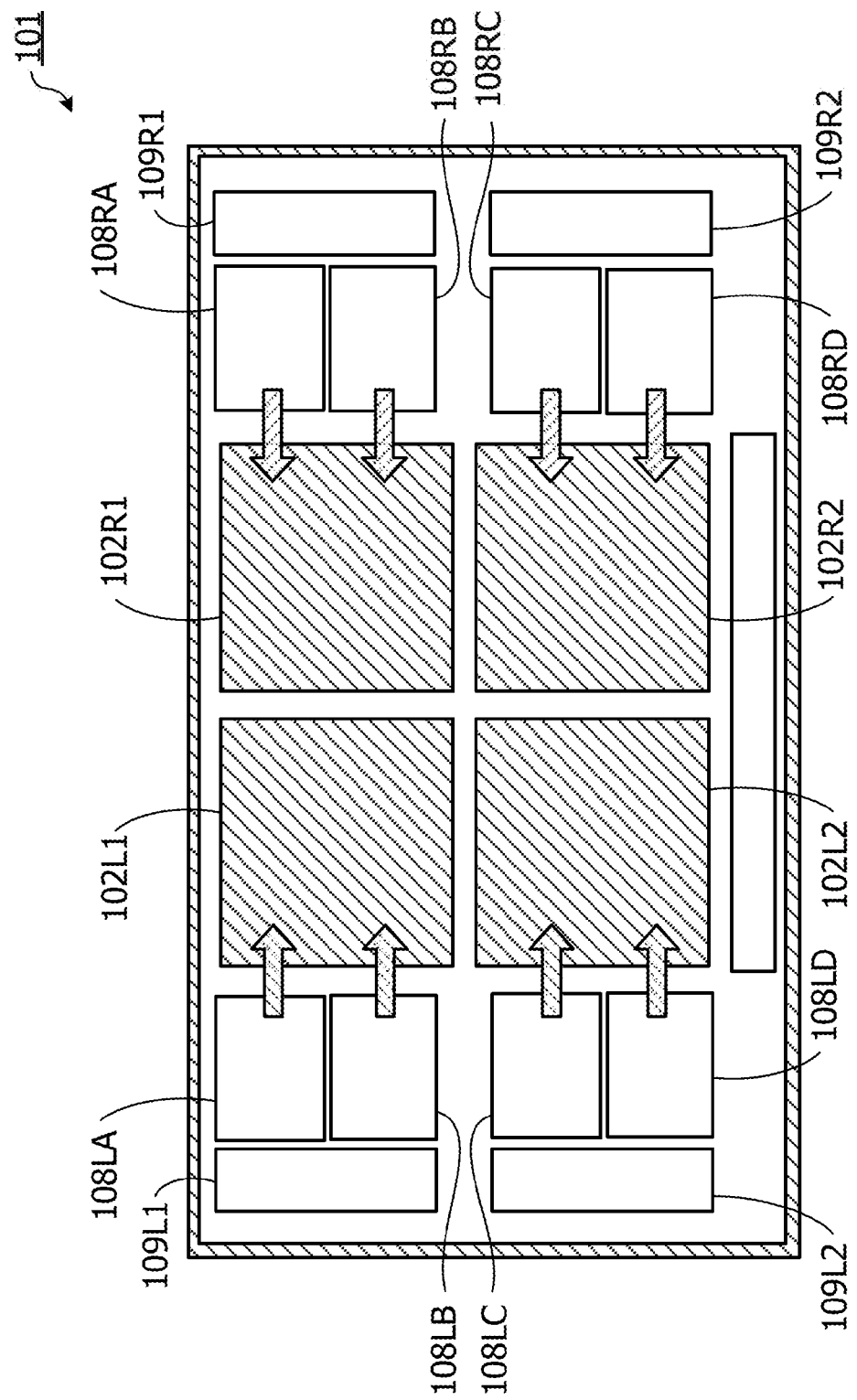
FIG. 3 is a vertical cross-sectional view of a rear-side internal structure of an information processing apparatus according to a comparative example.

FIG. 3 is a vertical cross-sectional view of a rear-side internal structure of an information processing apparatus according to a comparative example. Like the information processing apparatus 1, the information processing apparatus 101 includes four units 102L1, 102L2, 102R1, 102R2. The information processing apparatus 101, however, includes two cooling devices for each unit: cooling devices 108LA, 108LB for the unit 102L1; cooling devices 108LC, 108LD for the unit 102L2; cooling devices 108RA, 108RB for the unit 102R1; and cooling devices 108RC, 108RD for the unit 102R2. Furthermore, in the information processing unit 101, power supply units 109L1, 109L2, 109R1, 109R2 are provided in their respective locations corresponding to the power supply units 9L1, 9L2, 9R1, 9R2.

In a case where the space occupied by the cooling system in the information processing apparatus 101 according to the comparative example is made as large as that occupied by the cooling system in the information processing apparatus 1 according to the embodiment, the volume of each of the cooling devices 108LA, 108LB, 108LC, 108LD, 108RA, 108RB, 108RC, 108RD included in the information processing apparatus 101 according to the comparative example is smaller than that of each of cooling devices 8LA, 8LB, 8LC, 8RA, 8RB, 8RC included in the information processing apparatus 1 of the embodiment.

In general, when a cooling fan is downsized, a rate of a decrease in cooling performance of the cooling fan is larger than a rate of the reduction in the size of the cooling fan, and the downsizing of the cooling fan thus remarkably decreases the cooling performance of the cooling fan. For example, when the size of a cooling fan is reduced by half, the cooling performance of the cooling fan decreases to one quarter. For this reason, if one of the cooling fans stops its operation in the information processing apparatus 101, there is likelihood that the information processing apparatus 101 is incapable of maintaining the cooling performance requested by a corresponding object to be cooled. In contrast to this, the information processing apparatus 1 according to this embodiment enables the volume of each of the cooling devices 8LA, 8LB, 8LC, 8RA, 8RB, 8RC to be larger than that of each of the cooling devices 108LA, 108LB, 108LC, 108LD, 108RA, 108RB, 108RC, 108RD according to the comparative example while maintaining the redundant configuration. Thus, the rate of the decrease in the cooling performance of the information processing apparatus 1 according to this embodiment is smaller than that of the information processing apparatus 101 according to the comparative example. In other words, the information processing apparatus 1 according to the embodiment is capable of employing the redundant configuration while minimizing the decrease in the cooling performance of the downsized cooling fans as much as possible by reducing the number of the cooling devices.

Figure 4:
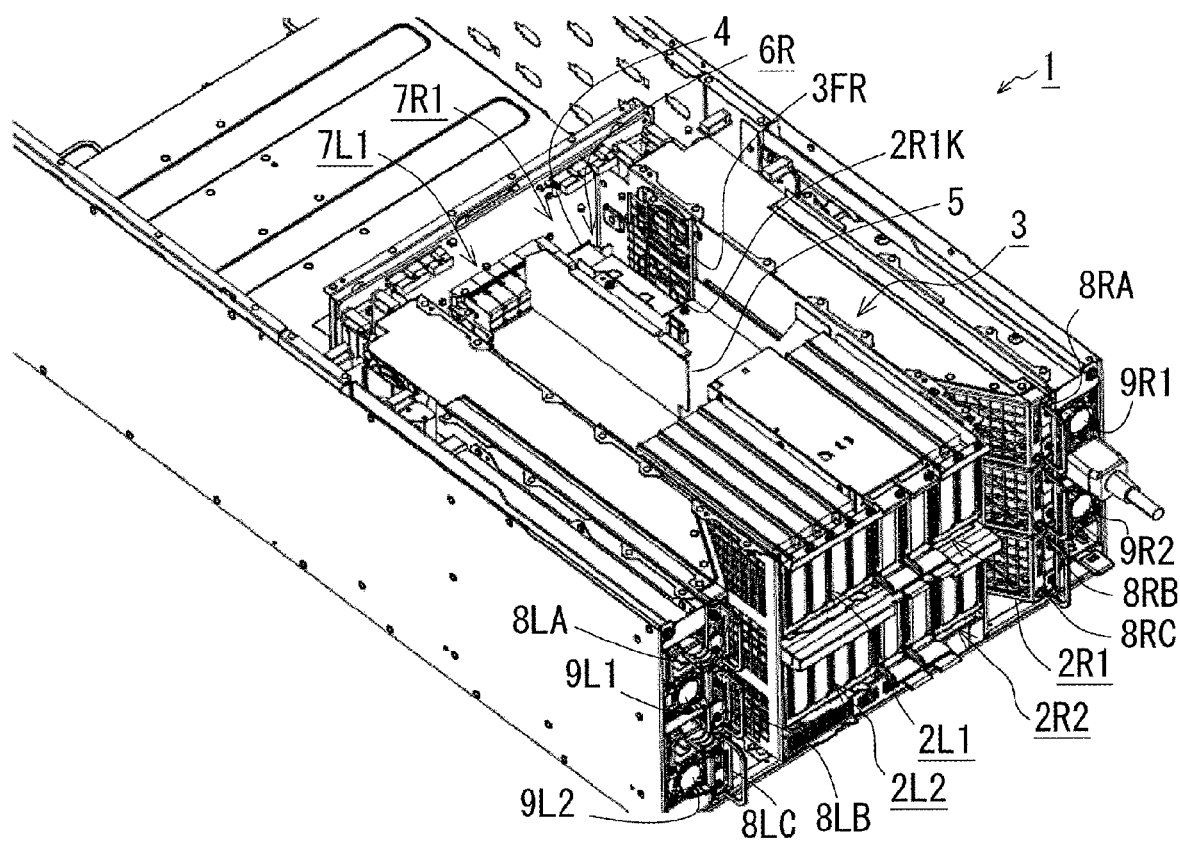
FIG. 4 is a first detailed rear-side perspective view of the information processing apparatus.

Descriptions will be hereinbelow provided for the detailed structure of the information processing apparatus 1. FIG. 4 is a first detailed perspective view of the information processing apparatus 1. FIG. 4 illustrates the information processing apparatus 1 where: the unit 2L1 is stored in the compartment 7L1; the unit 2L2 is stored in the compartment 7L2; the unit 2R1 is stored in the compartment 7R1; and the unit 2R2 is stored in the compartment 7R2. FIG. 4 illustrates the information processing apparatus 1 that further includes the six cooling devices 8LA, 8LB, 8LC, 8RA, 8RB, 8RC installed therein. Incidentally, FIG. 4 illustrates the information processing apparatus 1 with an upper lid opened. Thus, FIG. 4 illustrates the insides of the respective compartments 7L1, 7R1. The information processing apparatus 1, however, is used with the upper part of the information processing apparatus 1 covered with the lid, and accordingly with the compartments 7L1, 7R1 not opened to the outside.

Figure 5:
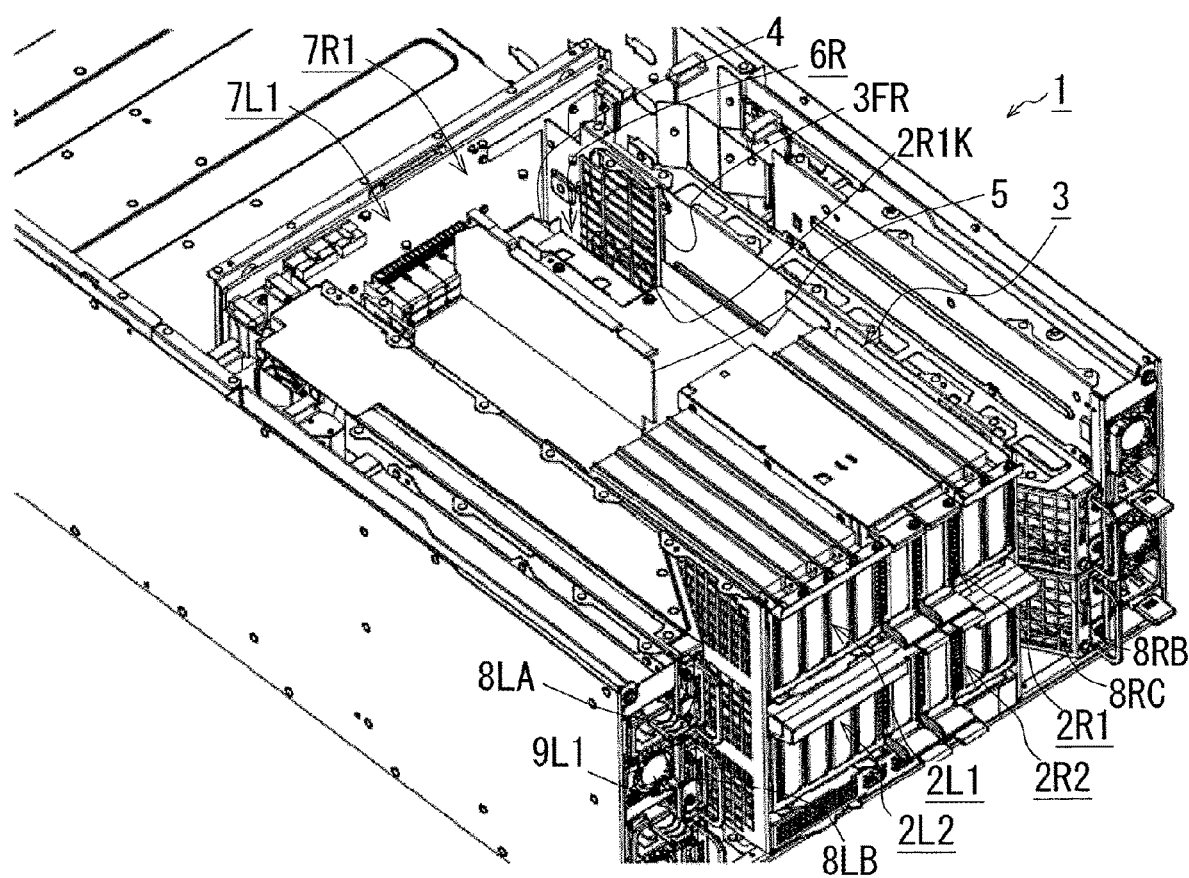
FIG. 5 is a second detailed rear-side perspective view of the information processing apparatus.

FIG. 5 is a second detailed perspective view of the information processing apparatus 1. FIG. 5 illustrates the information processing apparatus 1 with the cooling device 8RA detached from the information processing apparatus 1. The information processing apparatus 1 has a structure that allows the cooling devices 8LA, 8LB, 8LC, 8RA, 8RB, 8RC to be attached to and detached from the information processing apparatus 1. For example, no matter which of the cooling devices 8LA, 8LB, 8LC, 8RA, 8RB, 8RC goes out of order, the structure makes it possible for the operator to replace the broken cooling device with a new one regardless of whether or not the information processing apparatus 1 is in operation.

Figure 6:
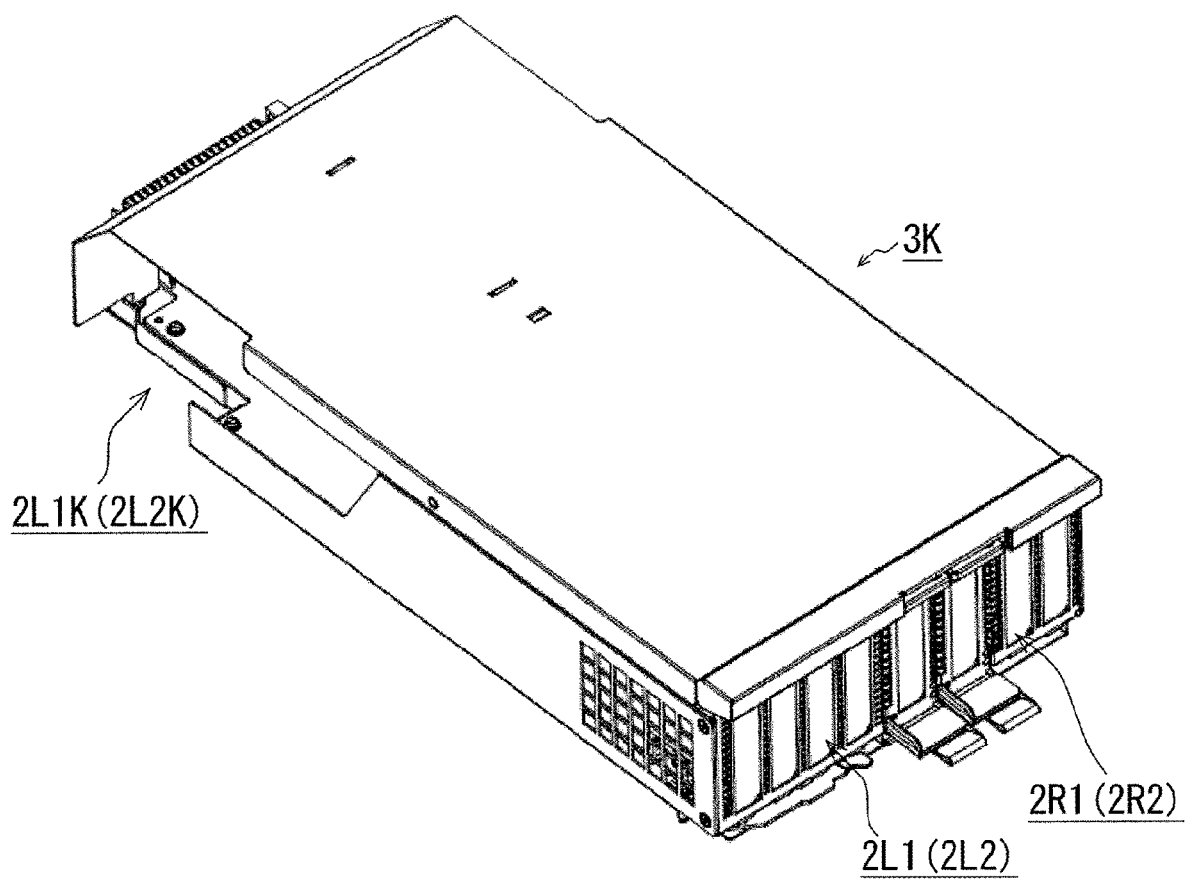
FIG. 6 is a first perspective view of units stored in a storage space.
Figure 7:
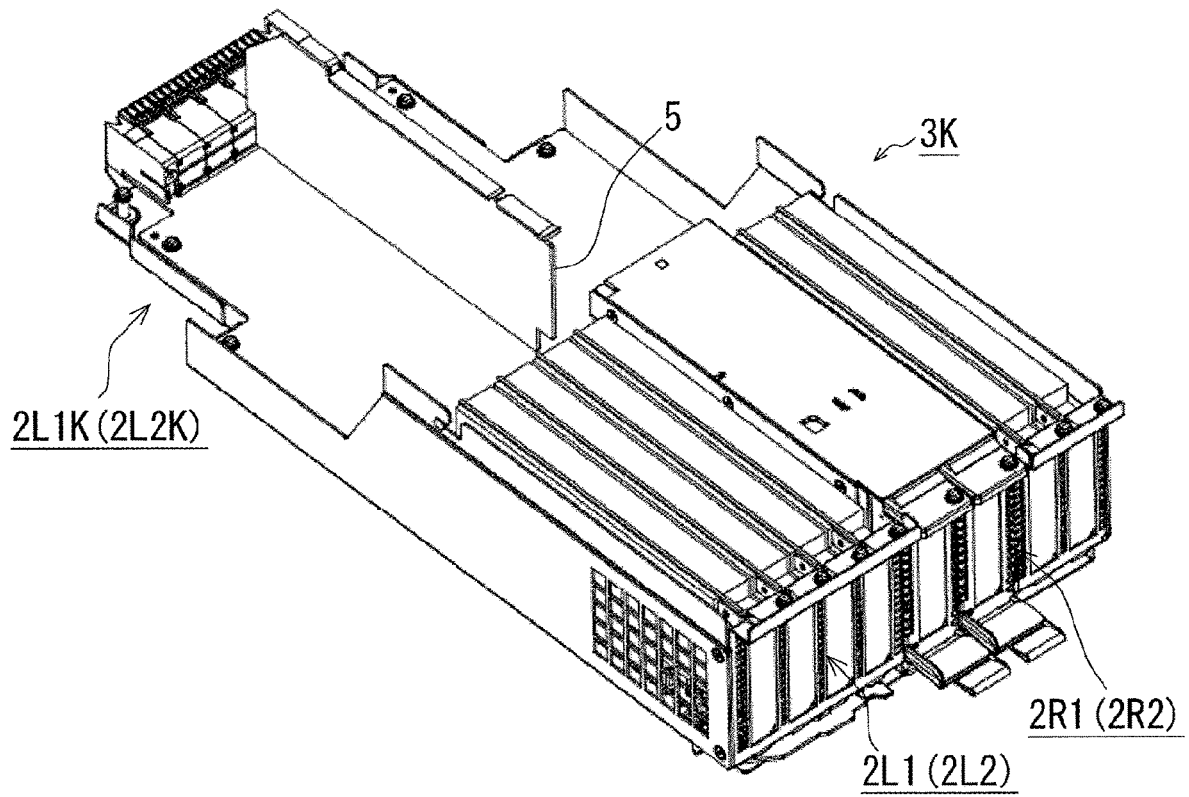
FIG. 7 is a second perspective view of the units stored in the storage space.

FIG. 6 is a first perspective view of the units 2L1, 2R1 (2L2, 2R2) stored in the storage space 3. FIG. 7 is a second perspective view of the units 2L1, 2R1 (2L2, 2R2) stored in the storage space 3. The units 2L1, 2R1 are stored in a single case 3K. FIG. 7 illustrates the case 3K with the upper lid opened. The partition plate 5 is formed from a plate material that is installed upright in a center part of the inside of the case 3K. The units 2L1, 2R1 (2L2, 2R2) are stored in the storage space 3 while contained and unified in the case 3K. The case 3K to contain the units 2L1, 2R1 (2L2, 2R2) includes the cuts 2L1K, 2R1K (2L2K, 2R2K) formed in its back-side left and right portions.

Figure 8:
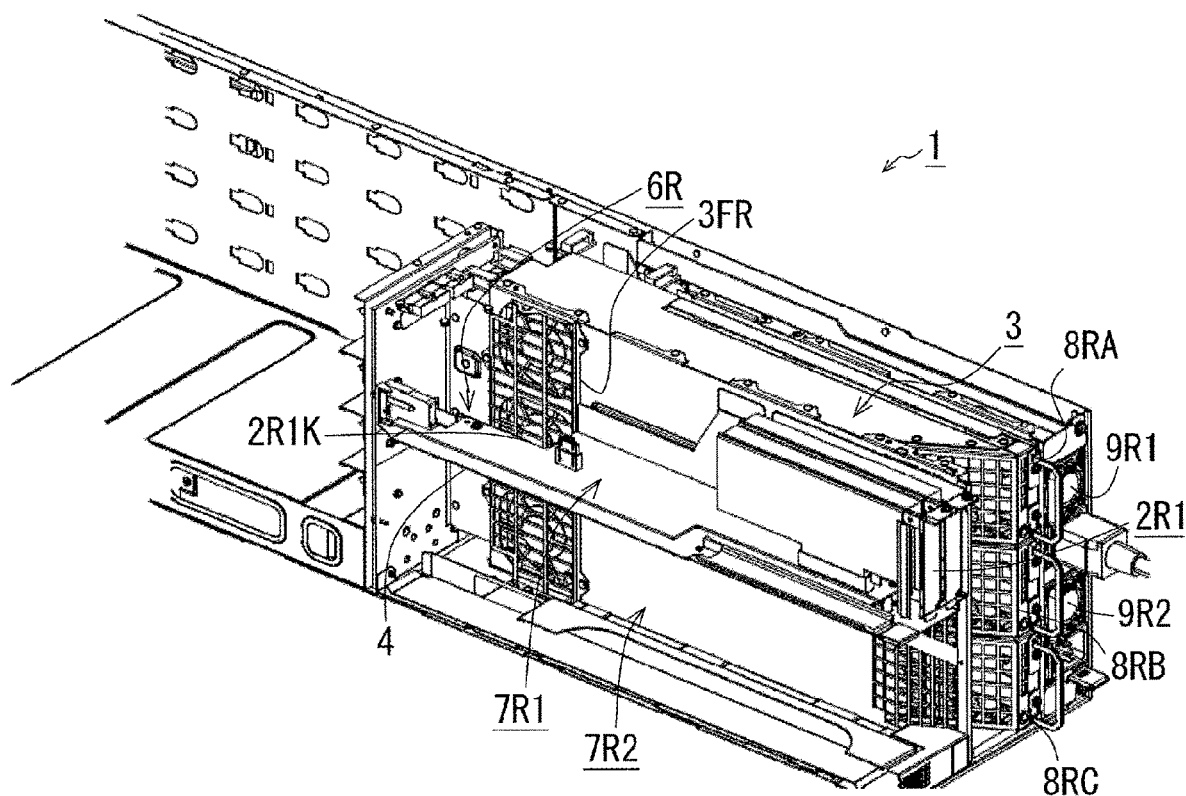
FIG. 8 is a perspective view of the internal structure of the information processing apparatus.

FIG. 8 is a perspective view of the internal structure of the information processing apparatus 1. FIG. 8 illustrates the internal structure of the information processing apparatus 1 with the case 3K storing the units 2L1, 2L2, and contained in an upper part of the inside of the storage space 3. Once the case 3K storing the units 2L1, 2L2 is contained in the upper part of the inside of the storage space 3, the cut 2R1K formed in the unit 2R1 is located in front of the air vent 3FR. This does not allow the unit 2R1 stored in the storage space 3 to hinder the compartments 7R1, 7R2 from communicating with each other through the opening 6R. What has been discussed about the unit 2R1 is also the case with the unit 2L1.

Figure 9:
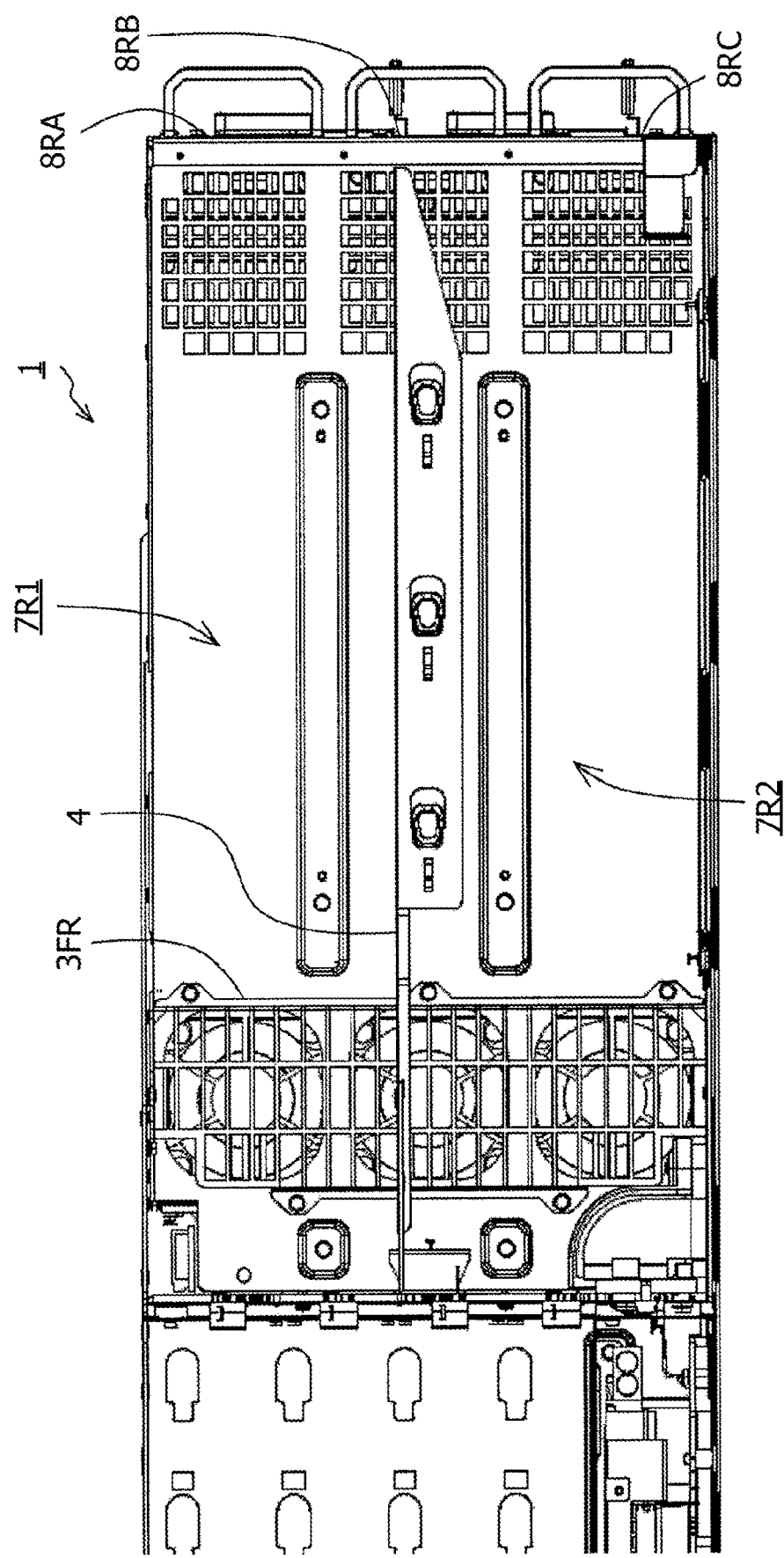
FIG. 9 is a diagram illustrating positional relationships among an air vent, a horizontal partition plate, and cooling devices.

FIG. 9 is a diagram illustrating positional relationships among the air vent 3FR, the horizontal partition plate 4, and the cooling devices 8RA, 8RB, 8RC. Once the cooling devices 8RA, 8RB, 8RC are attached to the information processing apparatus 1, the cooling fans of the cooling devices 8RA, 8RB, 8RC become seen through the air vent 3FR, as illustrated inside the air vent 3FR in FIG. 9. Thus, once the cooling fans of the cooling devices 8RA, 8RB, 8RC start their operations, air sucked in from the front of the information processing apparatus 1 flows into the compartments 7R1, 7R2 as the cooling wind. The horizontal partition plate 4 traverses the front of the cooling fan of the cooling device 8RB located in the central part of the air vent 3FR that is among the three cooling devices 8RA, 8RB, 8RC seen through the air vent 3FR. In other words, the cooling device 8RB sends the cooling wind through a part of the air vent 3FR that faces the horizontal partition plate 4. Accordingly, the cooling wind sent from the cooling device 8RB flows into both the compartment 7R1 and the compartment 7R2, while the cooling wind sent from the cooling device 8RA flows into the compartment 7R1 and the cooling wind sent from the cooling device 8RC flows into both the compartment 7R2.

Note that, as learned from FIG. 9, the horizontal partition plate 4 is located slightly upward of the center of the cooling fan of the cooling device 8RB. This is because the location of the horizontal partition plate 4 is determined in order to make the volume of cooling wind sent in from the cooling device 8RB almost equal between the compartment 7R1 and the compartment 7R2 with taken into consideration that, due to the internal structure of the cooling fan of the cooling device 8RB, the distribution of the volume of the cooling wind made by the cooling fan of the cooling device 8RB varies vertically. Accordingly, the location of the horizontal partition plate 4 relative to the cooling fan of the cooling device 8RB is changed upward or downward depending on the characteristics of the air volume distribution of the cooling wind that is generated by the cooling fan.

Figure 10:
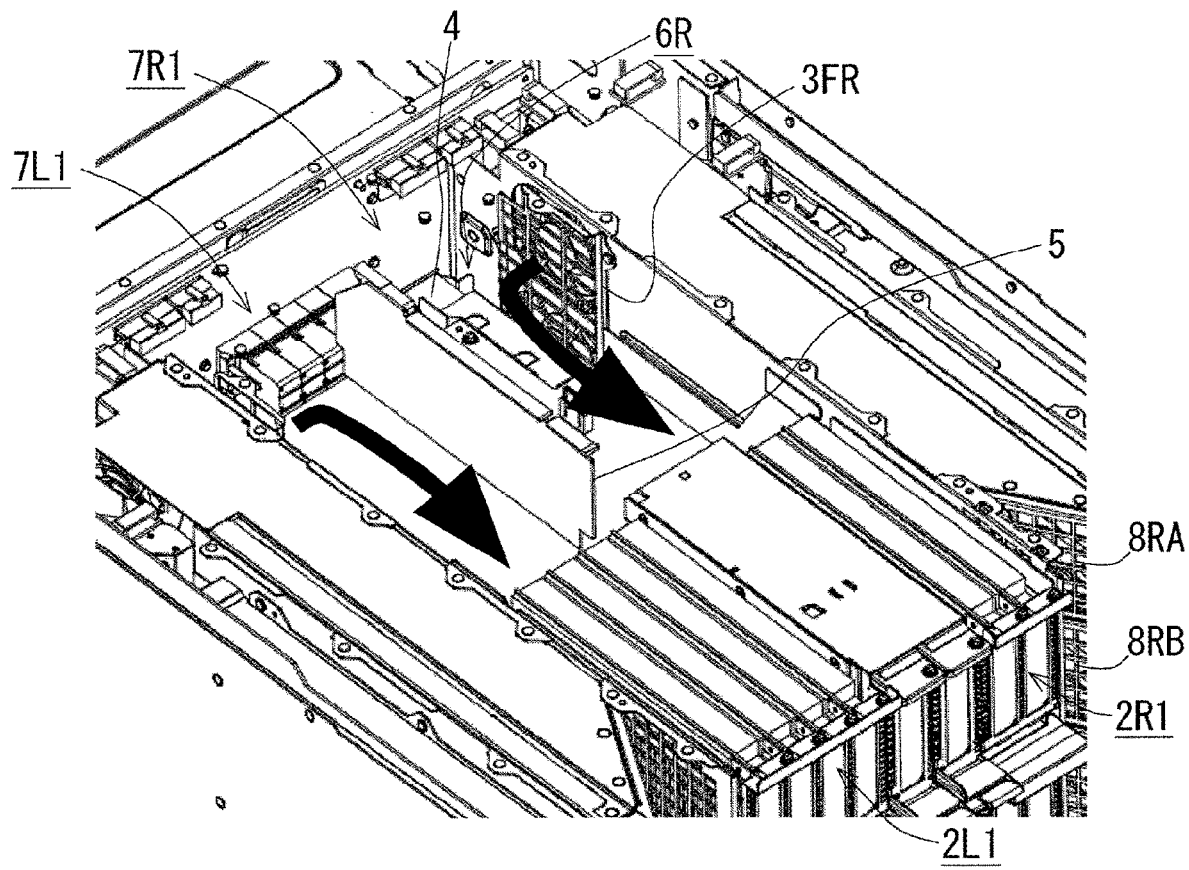
FIG. 10 is a first diagram illustrating air flows that flow respectively into compartments.

FIG. 10 is a first diagram illustrating air flows that flow into the respective compartments 7L1, 7R1. While the information processing apparatus 1 is in operation, the cooling winds sent from the cooling devices 8LA, 8LB flow into the compartment 7L1. The cooling wind having flowed into the compartment 7L1 changes its direction toward the unit 2L1 by being guided by the vertical partition plate 5, cools the unit 2L1 while passing through the inside of the unit 2L1, and is discharged from the back of the information processing apparatus 1. Meanwhile, the cooling wind having flowed into the compartment 7R1 from the cooling devices 8RA, 8RB changes its direction toward the unit 2R1 by being guided by the vertical partition plate 5, cools the unit 2R1 while passing through the inside of the unit 2R1, and is discharged from the back of the information processing apparatus 1.

Figure 11:
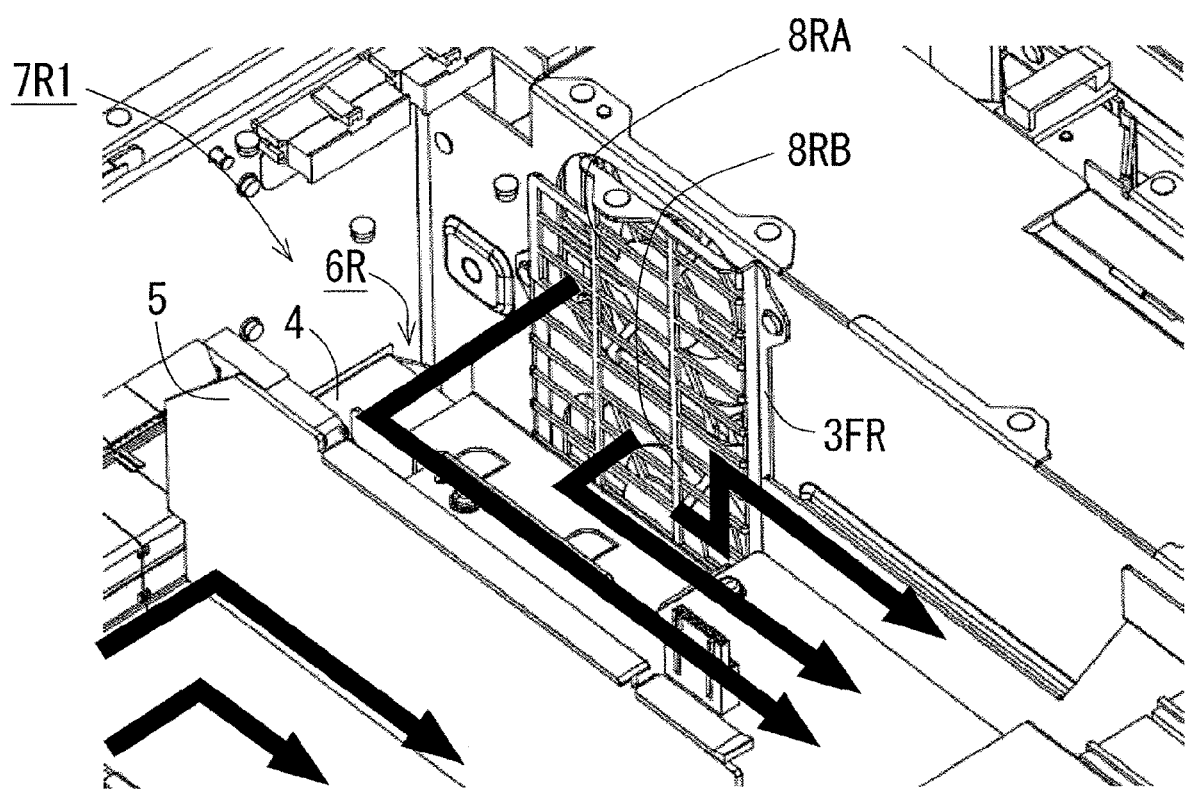
FIG. 11 is a first diagram illustrating air flows around the air vent.

FIG. 11 is a first diagram illustrating air flows around the air vent 3FR. In the information processing apparatus 1, the horizontal partition plate 4 traverses the front of the cooling fan of the cooling device 8RB. Thus, the cooling wind sent from the cooling device 8RB is divided by the horizontal partition plate 4 into a cooling wind that flows over the horizontal partition plate 4, and a cooling wind that flows under the horizontal partition plate 4. The cooling wind from the cooling device 8RB that is divided to flow over the horizontal partition plate 4, together with the cooling wind sent from the cooling device 8RA, flows into the unit 2R1.

Figure 12:
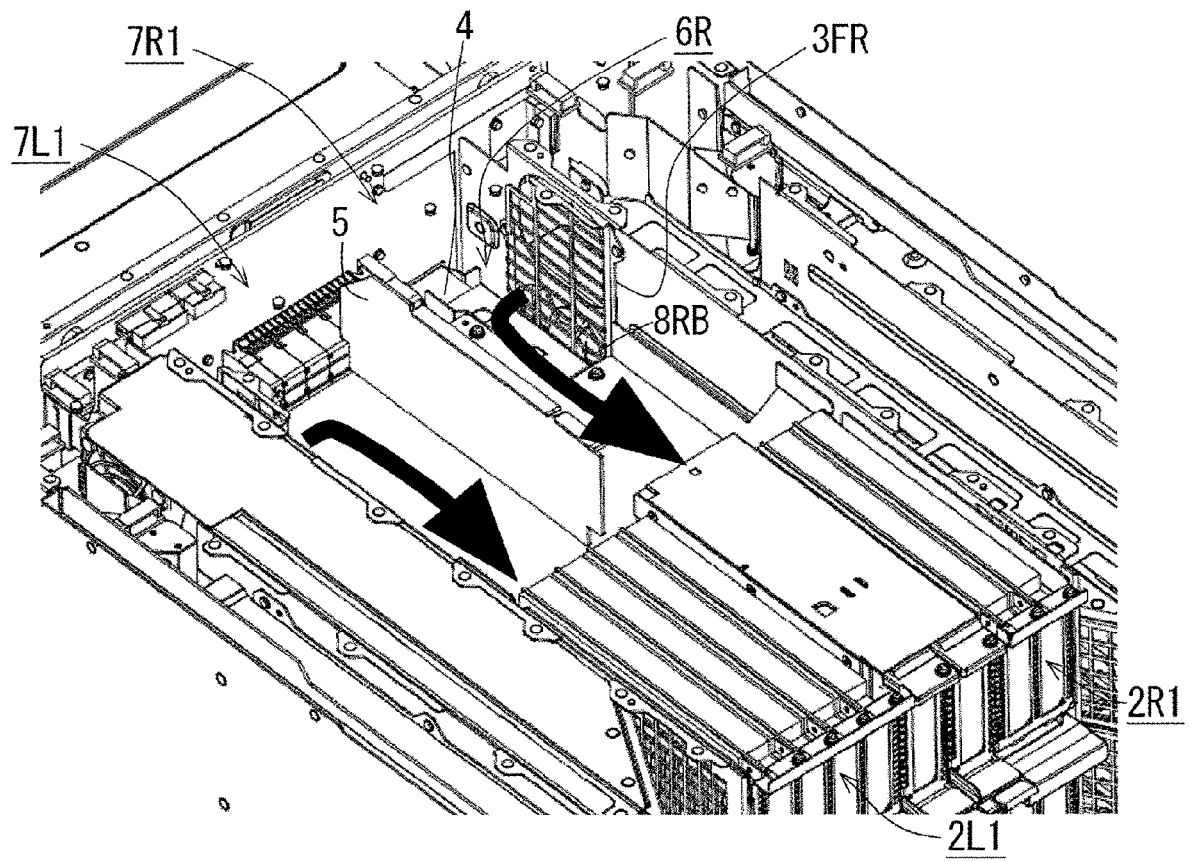
FIG. 12 is a second diagram illustrating air flows that flow into the respective compartments.

FIG. 12 is a second diagram illustrating air flows that flow into the respective compartments 7L1, 7R1. FIG. 12 illustrates air flows that flow in a case where the cooling device 8RA is detached from the information processing apparatus 1. Even in the case where the cooling device 8RA is detached from the information processing apparatus 1, the cooling wind sent from the cooling device 8RB flows into the compartment 7R1 while the information processing apparatus 1 is in operation. After flowing into the compartment 7R1, the cooling wind cools the unit 2R1 while passing through the inside of the unit 2R1, and is discharged from the back of the information processing apparatus 1.

Figure 13:
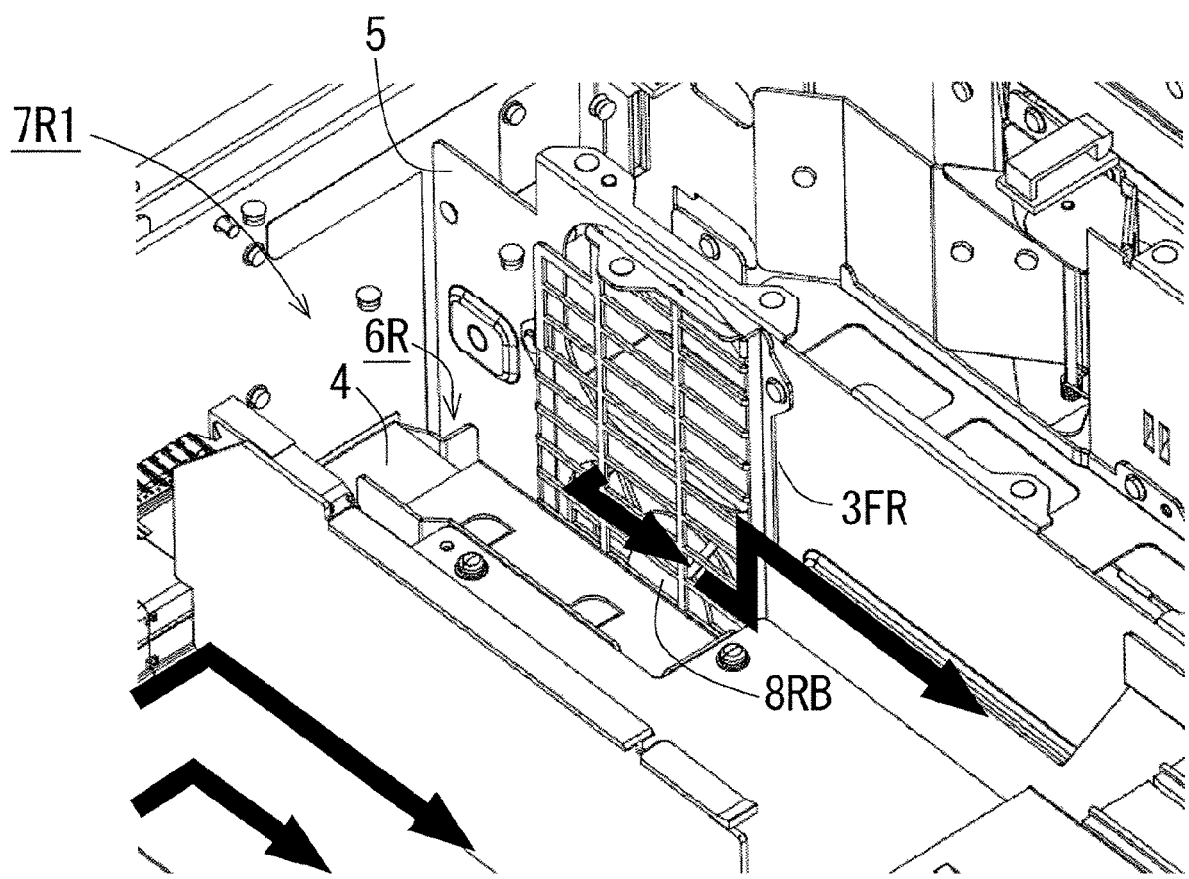
FIG. 13 is a second diagram illustrating air flows around the air vent.

FIG. 13 is a second diagram illustrating air flows around the air vent 3FR. In the information processing apparatus 1, the horizontal partition plate 4 traverses the front of the cooling fan of the cooling device 8RB. Thus, even in a case where the cooling device 8RA is detached from the information processing apparatus 1 so that no cooling wind comes from the location where the cooling device 8RA would otherwise be attached, the cooling wind from the cooling device 8RB that is divided by the horizontal partition plate 4 to flow over the horizontal partition plate 4 flows into the unit 2R1. In addition, since the cooling device 8RA which would otherwise send the cooling wind does not exist above the cooling device 8RB, part of the cooling wind that flows out toward the compartment 7R2 from the cooling device 8RB passes through the opening 6R, and flows toward the compartment 7R1. Accordingly, for example, even in the case where the cooling device 8RA is detached from the information processing apparatus 1 because the cooling device 8RA goes out of order and stops its operation, the information processing apparatus 1 is capable of making the unit 2R1 continue its operation while keeping the unit 2R1 cooled. In a case where one of the cooling devices 8LA, 8LB, 8LC, 8RB, 8RC is detached from the information processing apparatus 1, the information processing apparatus 1 is capable of making the corresponding unit continue its operation while keeping the unit cooled, like in the case where the cooling device 8RA is detached from the information processing apparatus 1.

Figure 14:
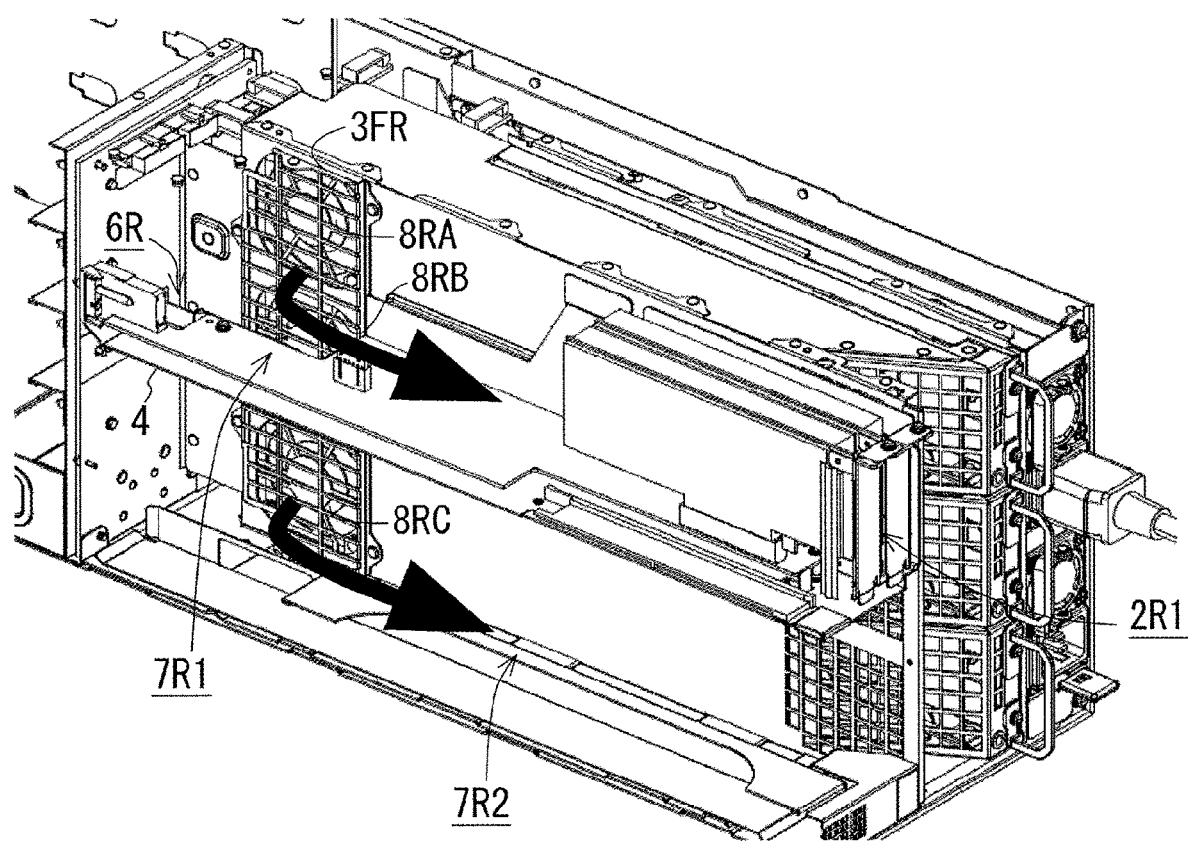
FIG. 14 is a third diagram illustrating air flows that flow into the respective compartments.

FIG. 14 is a third diagram illustrating air flows that flow into the respective compartments 7R1, 7R2. FIG. 14 illustrates the air flows that flow in a case where the units 2L2, 2R2 are detached from the information processing apparatus 1. While the information processing apparatus 1 is in operation, the cooling wind sent from the cooling device 8RA flows into the compartment 7R1. After flowing into the compartment 7R1, the cooling wind changes its direction toward the unit 2R1 by being guided by the vertical partition plate 5, cools the unit 2R1 while passing through the inside of the unit 2R1, and is discharged from the back of the information processing apparatus 1.

Figure 15:
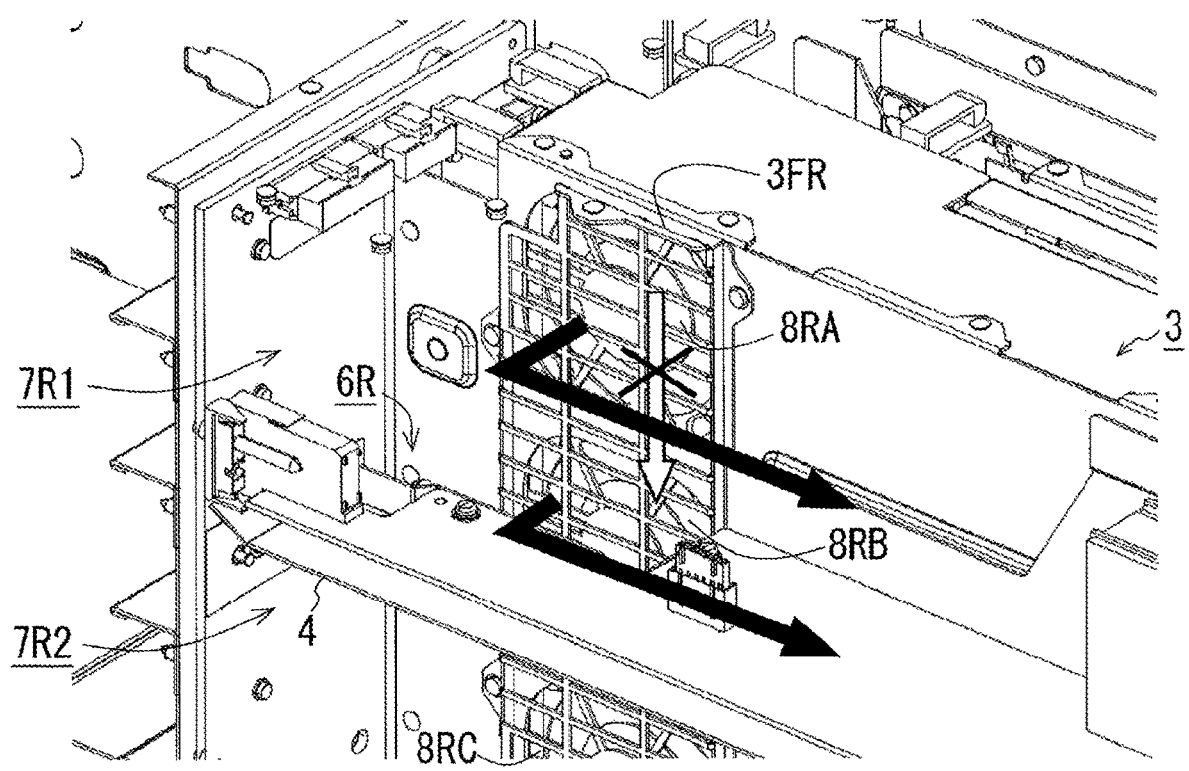
FIG. 15 is a third diagram illustrating air flows around the air vent.

FIG. 15 is a third diagram illustrating air flows around the air vent 3FR. In the case where the units 2L2, 2R2 are detached from the information processing apparatus 1, air resistance is smaller in the passage from the air vent 3FR to the back of the information processing apparatus 1 via the compartment 7R2 than in the passage from the air vent 3FR to the back of the information processing apparatus 1 via the compartment 7R1, since the units 2L2, 2R2 as physical obstacles do not exist in the passage from the air vent 3FR to the back of the information processing apparatus 1 via the compartment 7R2. Thus, in the case where the units 2L2, 2R2 are detached from the information processing apparatus 1, the cooling wind having flowed from the air vent 3FR into the storage space 3 flows toward the compartment 7R2 more easily. Since, however, in the information processing apparatus 1, the horizontal partition plate 4 traverses the front of the air vent 3FR, the cooling wind having flowed from the air vent 3FR into the storage space 3 is divided by the horizontal partition plate 4. Thus, the cooling wind that flows over the horizontal partition plate 4 from the cooling device 8RA and the cooling device 8RB flows into the unit 2R1. For this reason, for example, even in the case where the units 2L2, 2R2 are detached from the information processing apparatus 1 because the units 2L2, 2R2 go out of order and stop their operations, the information processing apparatus 1 is capable of making the units 2L1, 2R1 continue their operations while keeping the units 2L1, 2R1 cooled. In a case where the units 2L1, 2R1 are detached from the information processing apparatus 1, the information processing apparatus 1 is capable of making the units 2L2, 2R2 continue their operations while keeping the units 2L2, 2R2 cooled, like in the case where the units 2L2, 2R2 is detached from the information processing apparatus 1.

First Comparative Example

Figure 16:
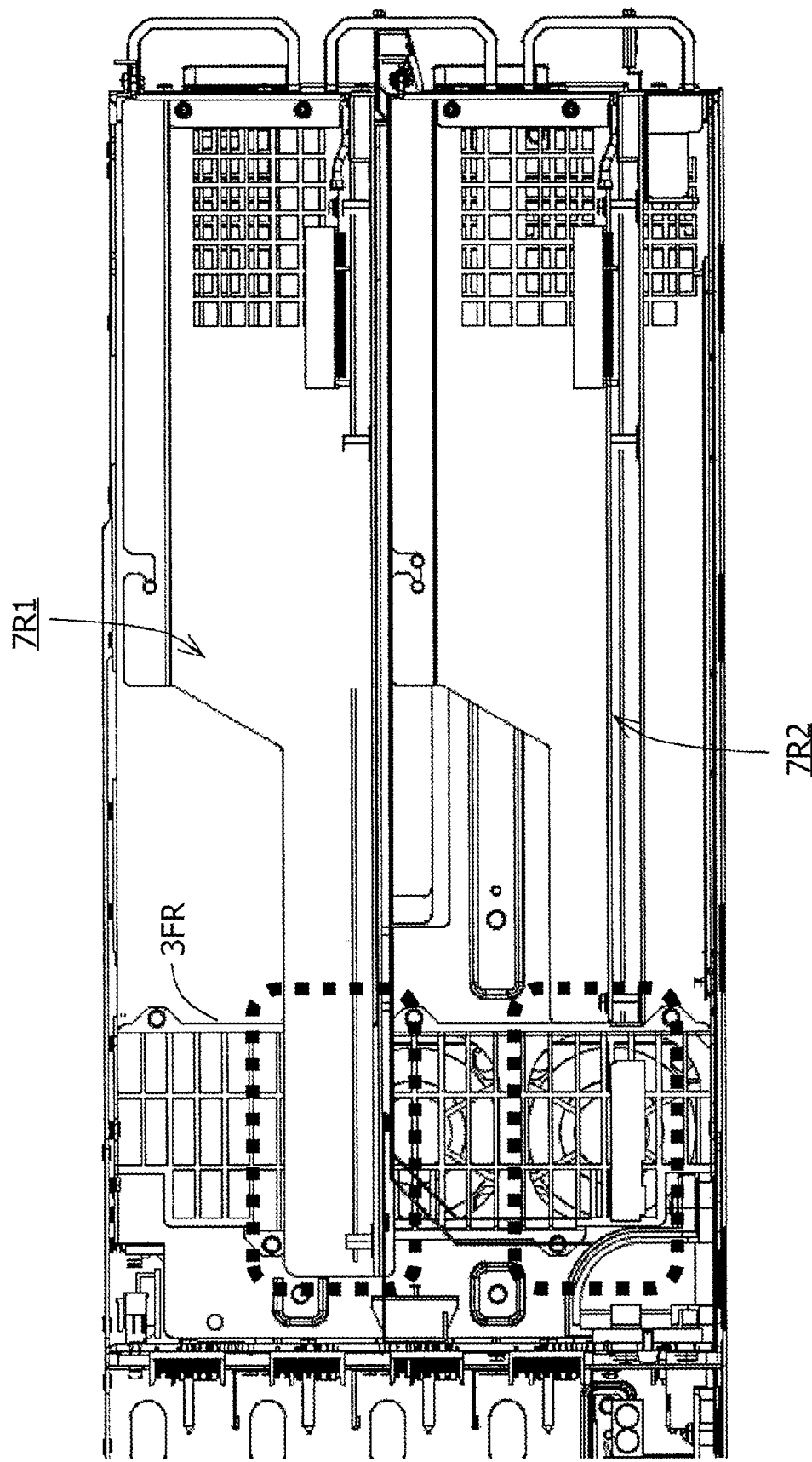
FIG. 16 is a diagram illustrating an internal structure of the information processing apparatus where units not provided with equivalents to cuts are stored in an upper part of the inside of the storage space.

Descriptions will be hereinbelow provided for what effect the cuts 2L1K, 2L2K, 2R1K, 2R2K bring about. FIG. 16 is a diagram illustrating an internal structure of the information processing apparatus 1 where units not provided with equivalents to the cuts 2L1K, 2R1K are stored in the upper part of the inside of the storage space 3. In the case where the units not provided with the equivalents to the cuts 2L1K, 2R1K are stored in the upper part of the inside of the storage space 3, the vicinity of the central part of the air vent 3FR is covered with the units that are stored in the upper part of the inside of the storage space 3, as learned from comparison between two areas each encircled by a dashed line in FIG. 16. Thus, the cooling wind sent from the cooling device 8RB that includes the cooling fan located in the vicinity of the central part of the air vent 3FR is blocked by the units stored in the upper part of the inside of the storage space 3, and almost no part of the cooling wind flows into the unit 2R1. For this reason, when the cooling device 8RA goes out of order, the information processing apparatus 1 almost loses the capability of cooling the unit 2R1.

Second Comparative Example

Figure 17:
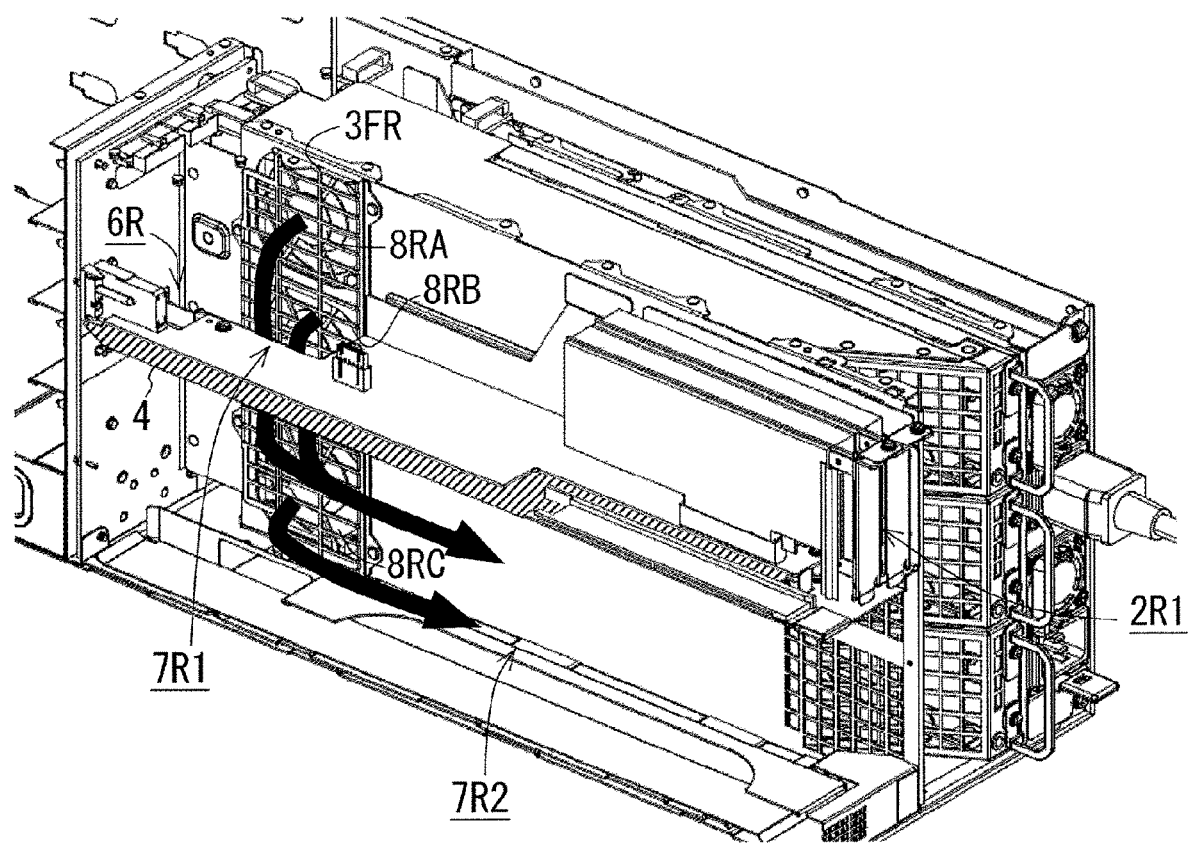
FIG. 17 is a diagram illustrating an internal structure of the information processing apparatus from which the horizontal partition plate is omitted.

Descriptions will be hereinbelow provided for what effect the horizontal partition plate 4 brings about. FIG. 17 is a diagram illustrating an internal structure of the information processing apparatus 1 from which the horizontal partition plate 4 is omitted. In FIG. 17, the omitted horizontal partition plate 4 is depicted with closely-drawn parallel lines. In the case where the units 2L2, 2R2 are detached from the information processing apparatus 1, the air resistance is smaller in the passage from the air vent 3FR to the back of the information processing apparatus 1 via the compartment 7R2 than in the passage from the air vent 3FR to the back of the information processing apparatus 1 via the compartment 7R1. Thus, in the case where the horizontal partition plate 4 that would otherwise traverse the front of the cooling fan of the cooling device 8RB is omitted, the cooling wind having flowed from the air vent 3FR into the storage space 3 is not divided by the horizontal partition plate 4. For this reason, the cooling wind having flowed from the air vent 3FR into the storage space 3 flows toward the compartment 7R2 more easily, and the information processing apparatus 1 loses the capability of cooling the unit 2R1.

Third Comparative Example

Figure 18:
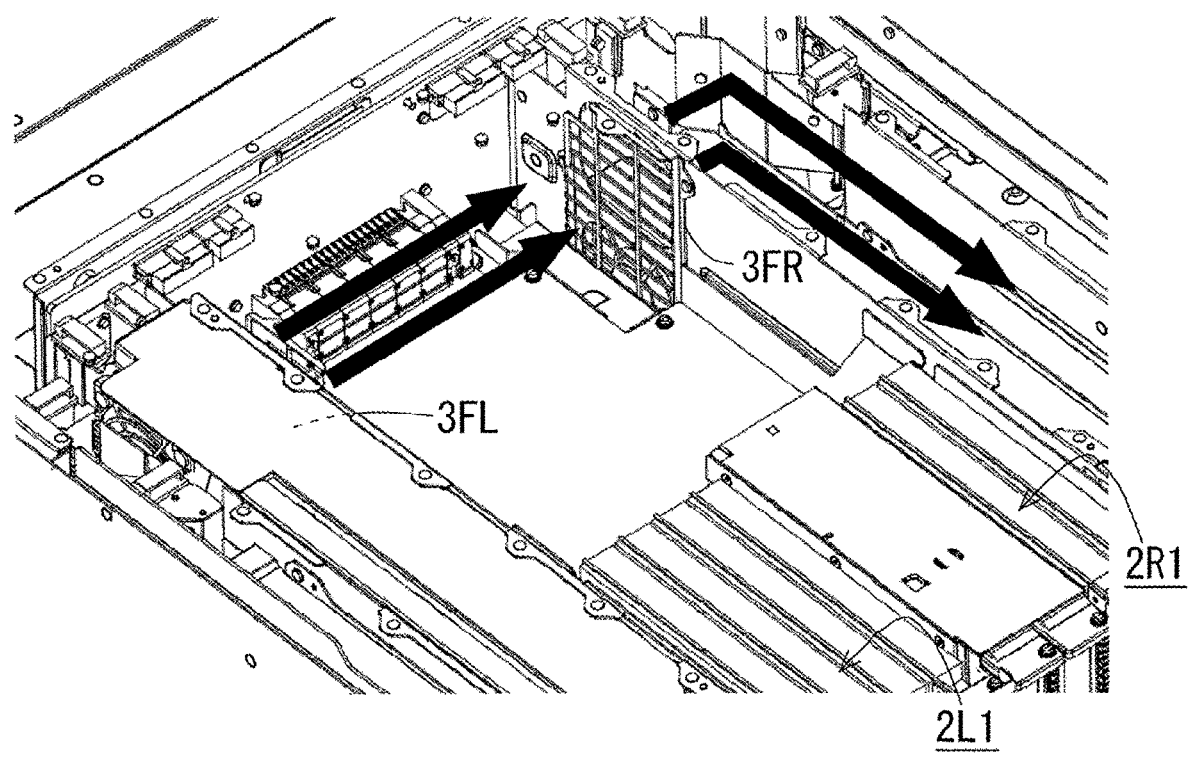
FIG. 18 is a diagram illustrating an internal structure of the information processing apparatus from which a vertical partition plate is omitted.

Descriptions will be hereinbelow provided for what effect the vertical partition plate 5 brings about. FIG. 18 is a diagram illustrating an internal structure of the information processing apparatus 1 from which the vertical partition plate 5 is omitted. In the case where the vertical partition plate 5 is omitted, the cooling wind having passed through the air vent 3FL flows toward the air vent 3FR that is placed facing the air vent 3FL. Thus, for example, in the case where the cooling device 8RA is detached from the information processing apparatus 1, the cooling wind from the air vent 3FR to the air vent 3FL is lost, and much of the cooling wind having blown out from the air vent 3FL toward the air vent 3FR accordingly flows into the air vent 3FR. In other words, the volume of the cooling wind from the air vent 3FL that passes the unit 2L1 and the unit 2R1 decreases to a large extent. In short, in the case where the vertical partition plate 5 is omitted, the cooling-related redundant configuration is not formed.

Figure 19:
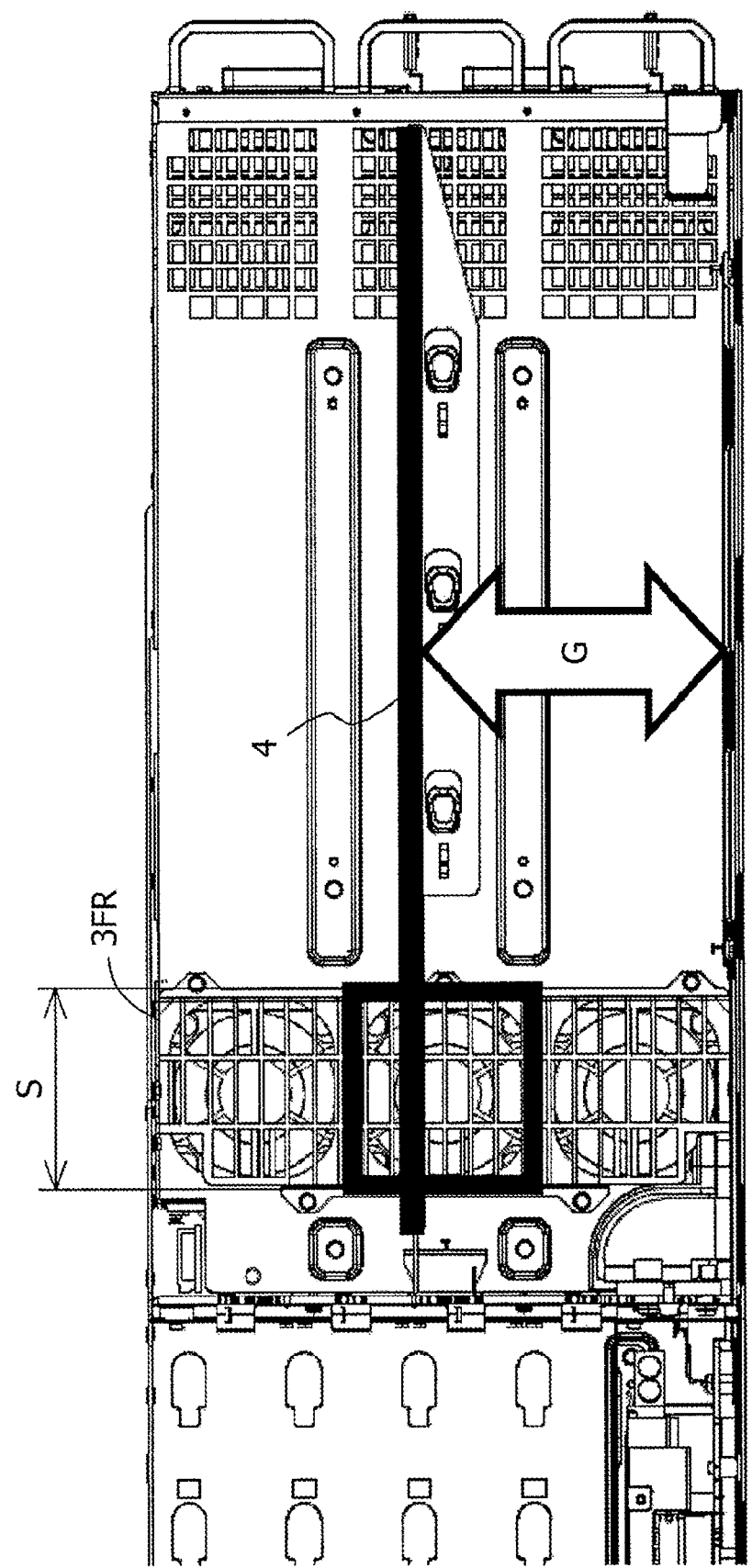
FIG. 19 is a first diagram illustrating dimensions of components in the information processing apparatus.
Figure 20:
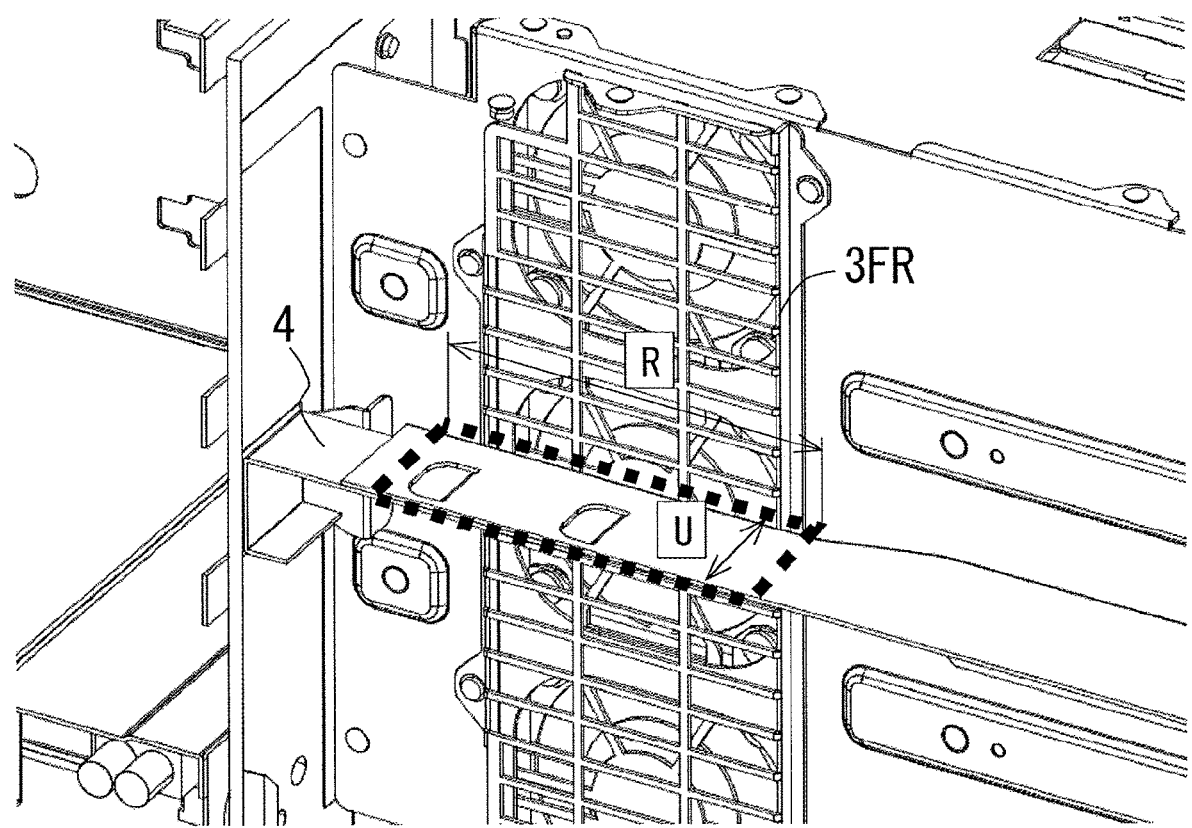
FIG. 20 is a second diagram illustrating the dimensions of the components in the information processing apparatus.
Figure 21:
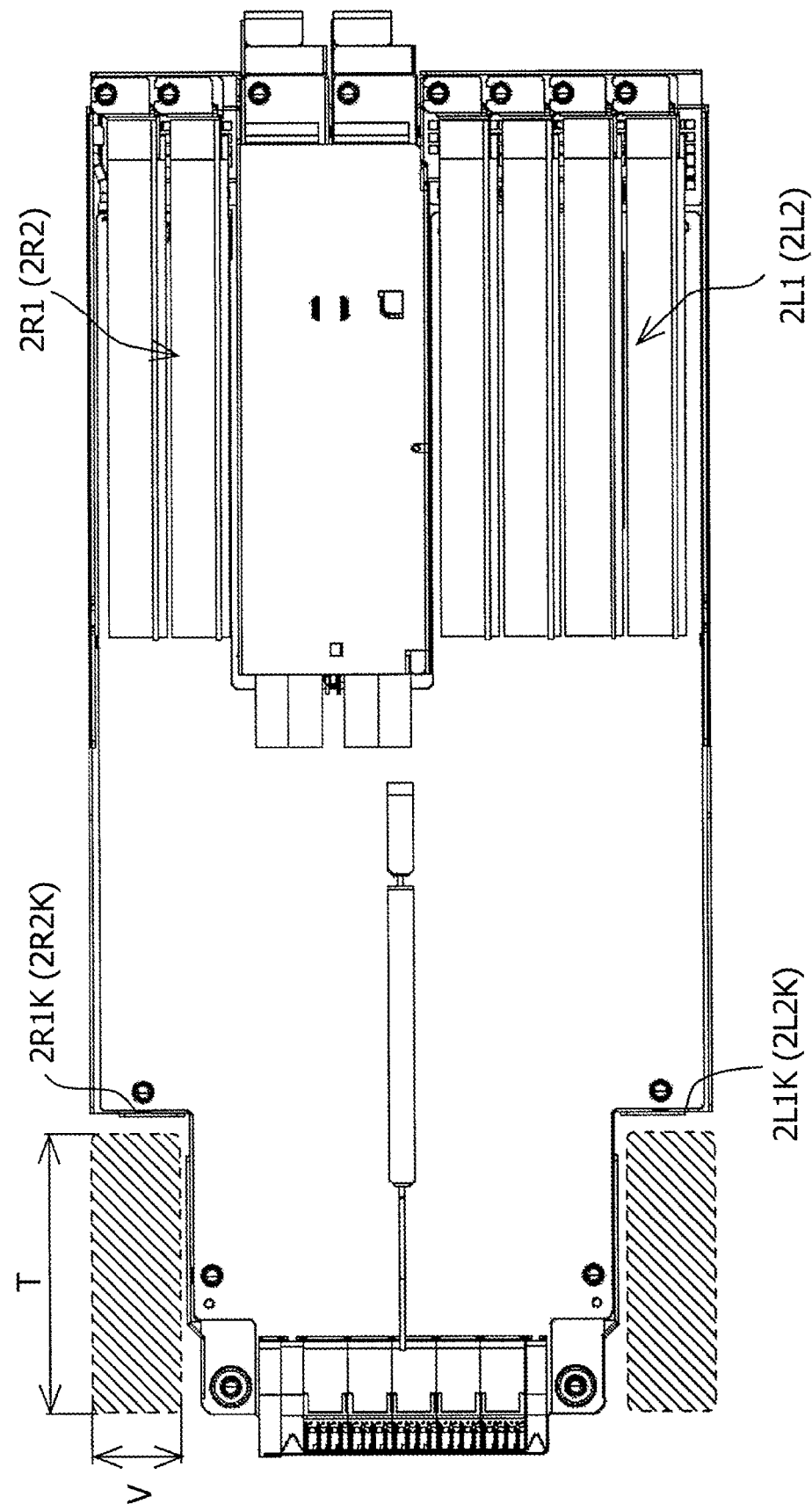
FIG. 21 is a third diagram illustrating the dimensions of the components in the information processing apparatus.

Note that it is desirable that the dimensions of the components of the information processing apparatus 1 be defined as follows, for example. FIG. 19 is a first diagram illustrating the dimensions of the components of the information processing apparatus 1. FIG. 20 is a second diagram illustrating the dimensions of the components of the information processing apparatus 1. FIG. 21 is a third diagram illustrating the dimensions of the components of the information processing apparatus 1.

For example, as illustrated in FIG. 19, reference sign G denotes the height of the horizontal partition plate 4 from the bottom surface of the storage space 3, and reference sign S denotes the width of the air vents 3FL, 3FR. In addition, as illustrated in FIG. 20, reference signs R, U respectively denote the width and depth of a part of the horizontal partition plate 4 that is located in front of the air vents 3FL, 3FR. Furthermore, as illustrated in FIG. 21, reference signs T, V respectively denote the width and depth of the air vents 3FL, 3FR.

In the case where the dimensions of the components of the information processing apparatus 1 are defined as discussed above, it is desirable that G be determined to be a height that makes the horizontal partition plate 4 divide the cooling wind from cooling devices 8LB, 8RB into two equal parts such that: one of them flows over the horizontal partition plate 4; and the other of them flows under the horizontal partition plate 4. The determination of G like this makes it possible for the cooling devices 8LB, 8RB to send the cooling wind to the upper and lower sides of the horizontal partition plate 4 equally. Furthermore, if one of the units 2L1, 2L2, 2R1, 2R2 is detached from the information processing apparatus 1, G determined like this makes it possible to keep the cooling wind from flowing out from the area where the unit is detached.

Moreover, it is desirable that R, T, S be determined such that they satisfy the following relational expression:

$$R>T>S.$$

In the case where R, T, S are determined such that they satisfy the above relational expression, it is possible to secure a flow passage for the cooling wind that flows from the air vents 3FL, 3FR into the storage space 3, and the cooling winds from the cooling devices 8LB, 8RB are accordingly capable of cooling the units 2L1, 2L2, 2R1, 2R2.

Besides, it is desirable that U, V be determined such that they satisfy the following relational expression:

$$U>V.$$

In the case where U, V are determined such that they satisfy the above relational expression, the dimensions of the units 2L1, 2R1 makes the units 2L1, 2R1 unable to become resistance to the cooling winds from the cooling devices 8LB, 8RB.

Note that results of comparison between the information processing apparatus 1 and the information processing apparatus 101 in terms of the dimensions were as illustrated in the following table.

TABLE 1

|  | Comparative Example | Embodiment |
| --- | --- | --- |
| Redundant Configuration | inclusive | inclusive |
| Number of Cooling Devices | 8 | 6 |
| Number of Cooling Devices for Each Side to Be Cooled | 2 | 1.5 |
| Height of Apparatus | Approximately 355 mm | Approximately 285 mm |

To put it specifically, when the information processing apparatus 1 according to the embodiment and the information processing apparatus 101 according to the comparative example were designed to exert the same cooling performance while maintaining the redundant configuration, the height of the information processing apparatus 1 was approximately 285 mm, whereas the height of the information processing apparatus 101 was approximately 355 mm. In short, it was found that the height of the information processing apparatus 1 was able to be shortened from that of the information processing apparatus 101 by approximately 20%.

Although the foregoing embodiment has discussed the information processing apparatus 1 on the assumption that the horizontal partition plate 4 lies horizontally and the vertical partition plate 5 stands vertically, the orientation of the information processing apparatus 1 is not limited to this. The information processing apparatus 1 may be set up, for example, in a way that: the horizontal partition plate 4 stands vertically; and the vertical partition plate 5 lies horizontally. Furthermore, although the foregoing embodiment provides the three cooling devices for the two units, the information processing apparatus 1 is not limited to this. The information processing apparatus 1 may be configured, for example, such that four or more cooling devices are provided for three or more units. Besides, although the foregoing embodiment is that where the three cooling devices are installed in each of the two sides of the storage space 3 so that the inside of the storage space 3 divided by the vertical partition plate 5 into the left and right halves is cooled by the left-side cooling devices and the right-side cooling devices, the storage space 3 is not limited to this. The information processing apparatus 1 may be configured, for example, such that: the three cooling devices on one of the left and right sides of the storage space 3 are omitted; the inside of the storage space 3 is not divided by the vertical partition plate 5; and the inside of the storage space 3 is cooled by the three cooling devices installed on the other of the left and right sides of the storage space 3.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing apparatus comprising:
   a storage space partitioned by a partition plate into a first compartment, having a first air vent, that store a first part to be cooled and a second compartment, having a second air vent, store a second part to be cooled;
   a first cooling device that is adjacent to the first air vent without being adjacent to the second air vent and sends cooling winds for the first part;
   a second cooling device that is adjacent to the second air vent without being adjacent to the second air vent and sends cooling winds for the second part;
   a third cooling device that is adjacent to the first air vent and the second air vent and sends cooling winds for the first part and the second part.

2. The information processing apparatus according to claim 1, wherein the partition plate has an opening that connecting the first compartment and the second compartment.

3. The information processing apparatus according to claim 2, wherein the opening is adjacent to the first air vent and second air vent.

4. The information processing apparatus according to claim 1, wherein
   the storage space is partitioned by the partition plate into two compartments, and
   the plurality of cooling devices are three cooling devices.

5. The information processing apparatus according to claim 1, wherein
   the storage space includes a pair of the first air vents or a pair of the second air vents, placed facing each other, in the inner surface, and
   the information processing apparatus further includes a second partition plate that partitions each compartment into a part at a side of one of the pair of the first air vents or the second air vents, and a part at a side of the other of the pair of the first air vents or second air vents.

* * * * *